(12) United States Patent
Chu et al.

(10) Patent No.: US 6,933,198 B2
(45) Date of Patent: Aug. 23, 2005

(54) METHOD FOR FORMING ENHANCED AREAL DENSITY SPLIT GATE FIELD EFFECT TRANSISTOR DEVICE ARRAY

(75) Inventors: Wen-Ting Chu, Kaohsiung (TW); Chia-Ta Hsieh, Tainan (TW); Chrong-Jung Lin, Hsin-Tien (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 85 days.

(21) Appl. No.: 10/326,501

(22) Filed: Dec. 20, 2002

(65) Prior Publication Data

US 2004/0121573 A1 Jun. 24, 2004

(51) Int. Cl.[7] .......................................... H01L 21/8247
(52) U.S. Cl. ..................................................... 438/266
(58) Field of Search ................................ 438/257–267, 438/593–594

(56) References Cited

U.S. PATENT DOCUMENTS

| 5,970,371 | A | * | 10/1999 | Hsieh et al. | ............... 438/593 |
|---|---|---|---|---|---|
| 6,207,503 | B1 | * | 3/2001 | Hsieh et al. | ............... 438/263 |
| 6,284,596 | B1 | * | 9/2001 | Sung et al. | ................ 438/257 |
| 6,329,245 | B1 | | 12/2001 | Da et al. | |
| 6,482,700 | B2 | * | 11/2002 | Chen et al. | ................ 438/267 |
| 6,486,032 | B1 | * | 11/2002 | Lin et al. | .................... 438/266 |
| 6,498,030 | B2 | * | 12/2002 | Hsieh | ......................... 438/257 |
| 6,541,339 | B1 | * | 4/2003 | Lin et al. | .................... 438/266 |
| 2002/0187608 | A1 | * | 12/2002 | Tseng | ......................... 438/257 |

OTHER PUBLICATIONS

Wolf, "Silicon Processing for the VLSI Era vol. 2: Process Integration", pp. 20 and 23–25, 1990, Lattice Press.*

* cited by examiner

Primary Examiner—Richard A. Booth
(74) Attorney, Agent, or Firm—Tung & Associates

(57) ABSTRACT

A method for forming a floating gate electrode within a split gate field effect transistor device provides for isotropically processing a blanket isotropically processable material layer having a patterned mask layer formed thereover to form a patterned isotropically processed material layer which encroaches beneath the patterned mask layer. The patterned isotropically processed material layer may then be employed as a mask for forming a floating gate electrode from a blanket floating gate electrode material layer. The method provides for forming adjacent floating gate electrodes with less than minimally photolithographically resolvable separation.

15 Claims, 4 Drawing Sheets

METHOD FOR FORMING ENHANCED AREAL DENSITY SPLIT GATE FIELD EFFECT TRANSISTOR DEVICE ARRAY

BACKGROUND OF THE INVENTION

1. Field of the Invention

The present invention relates generally to methods for forming split gate field effect transistor device arrays. More particularly, the present invention related to methods for forming split gate field effect transistor device arrays with enhanced areal density.

2. Description of the Related Art

A split gate field effect transistor device employs a floating gate electrode formed over and separated from a semiconductor substrate by a tunneling dielectric layer. The floating gate electrode defines a floating gate electrode channel within the semiconductor substrate. A split gate field effect transistor device further comprises a control gate electrode partially overlapping the control gate electrode and separated therefrom by an intergate electrode dielectric layer. The control gate electrode defines a control gate electrode channel adjoining the floating gate electrode channel within the semiconductor substrate. A split gate field effect transistor device finally comprises a pair of source/drain regions separated by the aggregate of the floating gate electrode channel and the control gate electrode channel.

To operate a split gate field effect transistor device, pre-determined voltages are applied to the control gate electrode, the source region, the drain region and the semiconductor substrate such as to allow for charge injection from the semiconductor substrate in the floating gate electrode, thus providing for nonvolatile charge storage. An additional pre-determined series of voltages may be employed for discharging and reading the stored charge.

While split gate field effect transistor devices provide a particularly common and desirable semiconductor device structure for non-volatile data storage and retrieval, split gate field effect transistor devices are nonetheless not entirely without problems.

In that regard, since split gate field effect transistor devices are fabricated employing plural overlapping gate electrode layers, split gate field effect transistor devices are often difficult to fabricate with enhanced areal density.

It is thus desirable to provide methods for fabricating split gate field effect transistor devices with enhanced areal density. It is towards the foregoing object that the present invention is directed.

Various methods have been disclosed within the semiconductor product fabrication art for forming, with desirable properties, split gate field effect transistor devices. Included but not limiting among the methods are those disclosed within Da et al., in U.S. Pat. No. 6,239,245 (a method for forming a split gate field effect transistor device with a reduced bit-line pitch).

Desirable are additional methods for forming split gate field effect transistor device arrays with enhanced areal density.

It is towards the foregoing object that the present invention is directed.

SUMMARY OF THE INVENTION

A first object of the invention is to provide a method for forming a split gate field effect transistor device array.

A second object of the invention is to provide a method in accord with the first object of the invention, wherein the split gate field effect transistor device array is formed with enhanced areal density.

In accord with the objects of the invention, the invention provides a method for forming a floating gate electrode for use within a split gate field effect transistor device.

The method first provides for a semiconductor substrate. The method also provides for forming a tunneling dielectric layer upon the semiconductor substrate. The method further provides for forming a blanket floating gate electrode material layer upon the tunneling dielectric layer. The method still further provides for forming a blanket isotropically processable material layer over the blanket floating gate electrode material layer. The method still further provides for forming a patterned mask layer upon the blanket isotropically processable material layer. The method then provides for isotropically processing the blanket isotropically processable material layer to form a patterned isotropically processed material layer which encroaches beneath the patterned mask layer. Finally, the method provides for etching the blanket floating gate electrode material layer to form a floating gate electrode while employing the patterned isotropically processed material layer as an etch mask layer.

The present invention provides a method for forming a split gate field effect transistor device with enhanced areal density.

The invention realizes the foregoing object by employing as an etch mask when forming a floating gate electrode from a blanket floating gate electrode material layer a patterned isotropically processed material layer which encroaches beneath a patterned mask layer which is employed as a mask when forming the patterned isotropically processed material layer from a blanket isotropically processable material layer. Due to the encroachment of the patterned isotropically processed material layer beneath the mask, a gap between adjacent patterned isotropically processed material layers may be less than a linewidth of the patterned mask layer, which may otherwise be formed at a minimum photolithographically resolvable linewidth. Thus, a pair of floating gate electrodes may be formed with closer spacing and a pair of split gate field effect transistor devices incorporating the pair of floating gate electrodes may be formed with enhanced areal density.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a split gate field effect transistor device with enhanced areal density.

The invention realizes the foregoing object by employing as an etch mask when forming a floating gate electrode from a blanket floating gate electrode material layer a patterned isotropically processed material layer which encroaches beneath a patterned mask layer which is employed as a mask when forming the patterned isotropically processed material layer from a blanket isotropically processable material layer. Due to the encroachment of the patterned isotropically processed material layer beneath the mask, a gap between adjacent patterned isotropically processed material layers may be less than a linewidth of the patterned mask layer, which may otherwise be formed at a minimum photolithographically resolvable linewidth. Thus, a pair of floating gate electrodes may be formed with closer spacing and a pair of split gate field effect transistor devices incorporating the pair of floating gate electrodes may be formed with enhanced areal density.

FIG. 1 to FIG. 15 show a series of schematic plan-view and cross-sectional diagrams illustrating the results of progressive stages of forming a split gate field effect transistor device in accord with the present invention.

Figure 1:
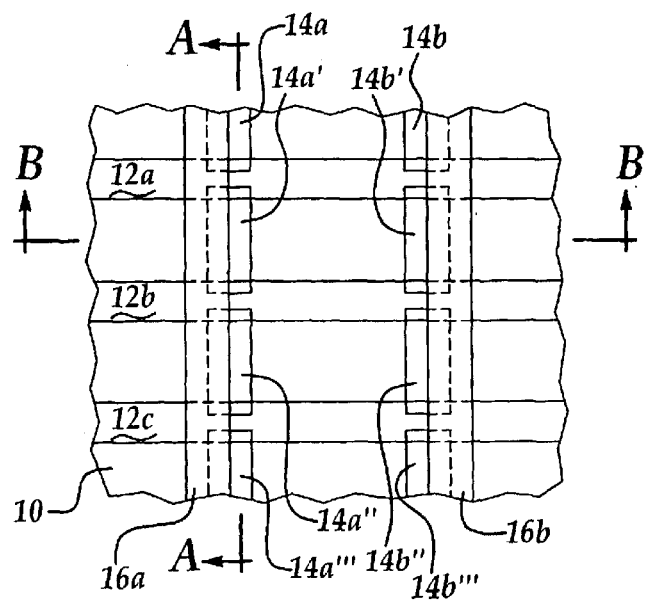
FIG. 1 to FIG. 15 show a series of schematic plan-view and cross-sectional diagrams illustrating the results of progressive stages of forming a split gate field effect transistor device in accord with the invention.

FIG. 1 shows a schematic plan-view diagram of a split gate field effect transistor device array which is intended solely to provide reference planes for the cross-sectional diagrams which follow. Reference numerals for specific structures within FIG. 1 do not correspond with reference numerals within the remaining cross-sectional diagrams since several features within the following description are omitted within the schematic plan-view diagram of FIG. 1.

FIG. 1 illustrates a semiconductor substrate 10 having formed thereupon a tunneling dielectric layer. FIG. 1 also illustrates a series of isolation regions 12a, 12b and 12c which define a series of active regions of the semiconductor substrate 10. Formed primarily over the active regions, but also bridging over the series of isolation regions 12a, 12b and 12c is a series of floating gate electrodes 14a, 14a', 14a", 14a''', 14b, 14b', 14b" and 14b'''. Finally, FIG. 1 illustrates a control gate electrode 16a partially overlapping the series of floating gate electrodes 14a, 14a', 14a" and 14a''', and a control gate electrode 16b partially overlapping the series of floating gate electrodes 14b, 14b', 14b" and 14b'''.

The invention provides a method for diminishing an end-to-end spacing of the series of floating gate electrodes 14a, 14a', 14a" and 14a''' or the series of floating gate electrodes 14b, 14b', 14b" and 14b' ". Thus, the array of split gate field effect transistor devices as illustrated within the schematic plan-view diagram of FIG. 1 may be formed with enhanced areal density.

FIG. 2 to FIG. 9 show a series of schematic cross-sectional diagrams illustrating the results of progressive stages of forming upon a semiconductor substrate an array of split gate field effect transistor devices in accord with the schematic plan-view diagram of FIG. 1, as viewed through the cross-section A—A.

Figure 2:
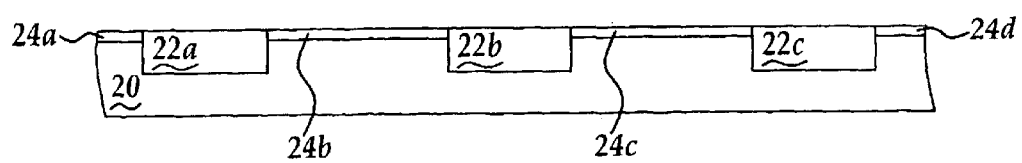

FIG. 2 illustrates a semiconductor substrate 20 having formed therein a series of isolation regions 22a, 22b and 22c which defines a series of active regions of the semiconductor substrate 10. Also illustrated within FIG. 2 is a series of tunneling dielectric layers 24a, 24b, 24c and 24d (which also serve as gate dielectric layers) formed upon the series of active regions of the semiconductor substrate 10.

Within the invention, the semiconductor substrate 10 may be of either dopant polarity, several dopant concentrations and various crystallographic orientations. Typically, the semiconductor substrate 10 is a (100) silicon semiconductor substrate. Typically, the series of isolation regions 12a, 12b and 12c is formed of a silicon oxide material formed and planarized into a series of isolation trenches to form the series of isolation regions 12a, 12b and 12c as a series of shallow trench isolation regions. Typically, the series of tunneling dielectric layers 24a, 24b, 24c and 24d is each formed to a thickness of from about 30 to about 70 angstroms, and formed of a silicon oxide material while employing a thermal oxidation method.

Figure 3:
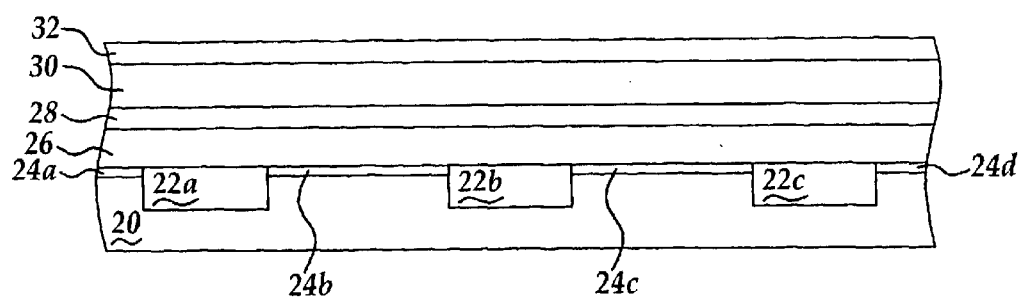

FIG. 3 illustrates the results of forming upon the semiconductor product of FIG. 2 a series of four blanket layers. The series of four blanket layers includes: (1) a blanket floating gate electrode material layer 26 formed upon the series of isolation regions 22a, 22b and 22c and the series of tunneling dielectric layers 24a, 24b, 24c and 24d; (2) a blanket isotropic processing stop layer 28 formed upon the blanket floating gate electrode material layer 26; (3) a blanket isotropically processable material layer 30 formed upon the blanket isotropic processing stop layer 28; and (4) a blanket mask layer 32 formed upon the blanket isotropically processable material layer 30.

Within the invention, in particular, the blanket isotropically processable material layer 30 is formed of an isotropically processable material which is isotropically processed within the context of further description below. The blanket isotropic processing stop layer 28 serves as a stop layer with respect to the isotropic processing of the blanket isotropically processable material layer 30. Although the present invention does not preclude alternative materials combinations, each of the blanket floating gate electrode material layer 26 and the blanket isotropically processable material layer 30 is formed of a polysilicon material, although the blanket isotropically processable material layer 30 may also be formed of an amorphous silicon material. The blanket floating gate electrode material layer 26, but not the blanket isotropically processable material layer 30, is formed of a doped polysilicon material (having a dopant concentration of from about 1E18 to about 1E20 dopant atoms per cubic centimeter). In addition, each of the blanket isotropic processing stop layer 28 and the blanket mask layer 32 is formed of a silicon nitride material. Typically, the blanket floating gate electrode material layer 26 is formed to a thickness of from about 500 to about 3500 angstroms, the blanket isotropic processing stop layer is formed to a thickness of from about 300 to about 2000 angstroms, the blanket isotropically processable material layer 30 is formed to a thickness of from about 300 to about 1500 angstroms and the blanket mask layer 32 is formed to a thickness of from about 200 to about 2000 angstroms.

Figure 4:
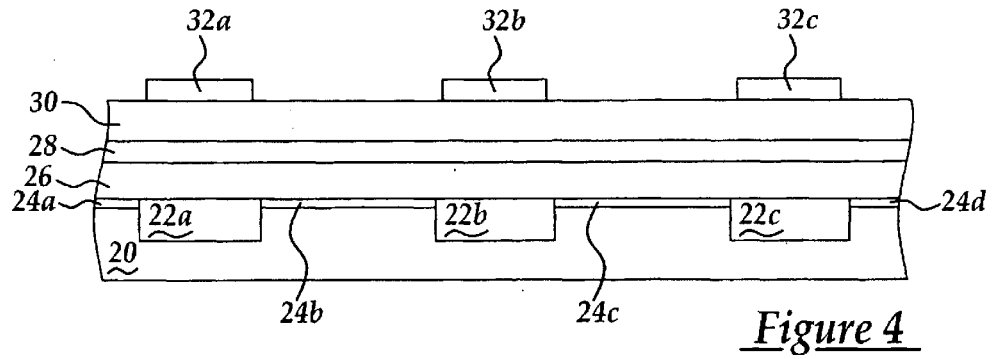

FIG. 4 illustrates the results of patterning the blanket mask layer 32 to form a series of patterned mask layers 32a, 32b and 32c. Such patterning may be effected employing methods and materials as are otherwise generally conventional in the semiconductor product fabrication art.

Figure 5:
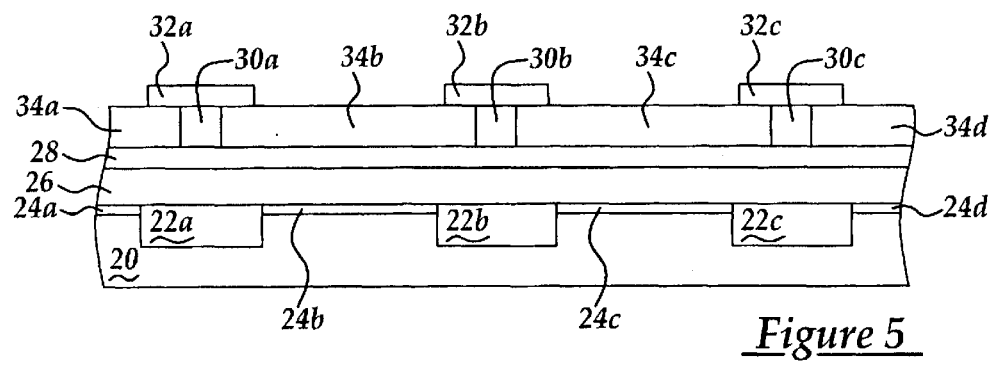

FIG. 5 illustrates the results of isotropically processing the blanket isotropically processable material layer 30 to form a series of patterned isotropically processable material layers 30a, 30b and 30c beneath the series of patterned mask layers 32a, 32b and 32c. Remaining exposed portions of the blanket isotropically processable material layer 30 have been isotropically processed to form a series of patterned isotropically processed material layers 34a, 34b, 34c and 34d which encroach beneath the series of patterned mask layers 32a, 32b and 32c. Within the invention when the blanket isotropically processable material layer 30 is formed of a polysilicon material or an amorphous silicon material and the blanket isotropic processing stop layer 28 is formed of a silicon nitride material, the blanket isotropically processable material layer 30 is isotropically thermally annealed to form the series of patterned isotropically processed material layers 34a, 34b, 34c and 34d formed of a silicon oxide material. Typically, the thermal annealing is undertaken at a temperature of from about 900 to about 1100 degrees centigrade, for a time period of from about 1 to about 3 hours. Typically, the encroachment of the series of patterned isotropically processed material layers 34a, 34b, 34c and 34d beneath the series of patterned mask layers 32a, 32b and 32c is from about 500 to about 2000 angstroms.

Figure 6:
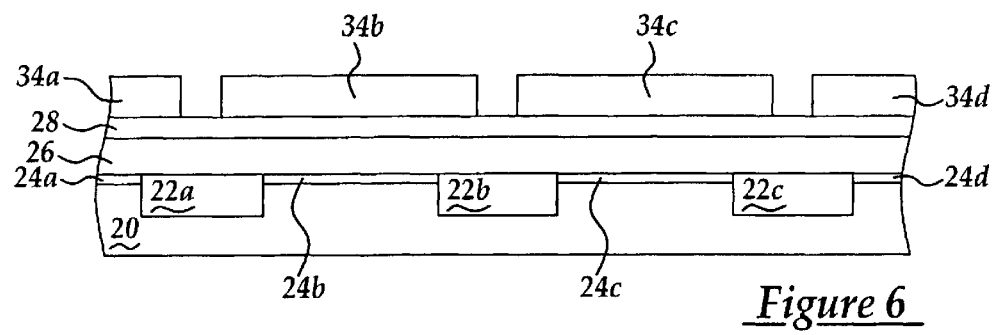

FIG. 6 illustrates the results of stripping the series of patterned mask layers 32a, 32b and 32c and the series of patterned isotropically processable material layers 30a, 30b and 30c from the semiconductor product as illustrated in FIG. 5.

The series of patterned mask layers 32a, 32b and 32c when formed of a silicon nitride material may be stripped while employing an aqueous phosphoric acid etchant at elevated temperature. The series of patterned isotropically processable material layers 30a, 30b and 30c when formed of a polysilicon material may be stripped while employing a nitric, hydrofluoric and acetic acid mixture at elevated temperature.

Figure 7:
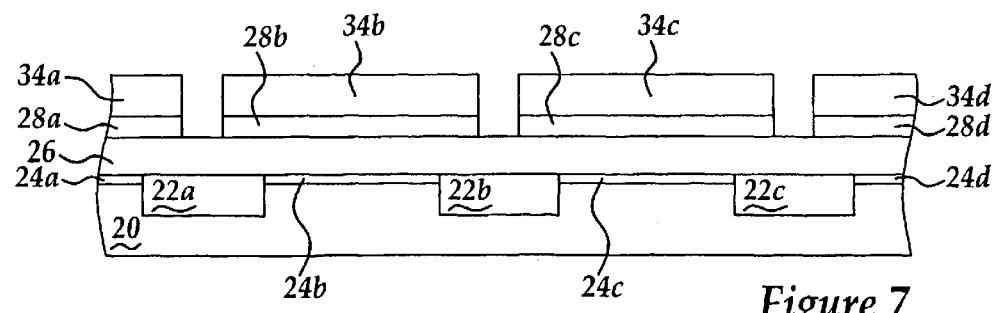

FIG. 7 illustrates the results patterning the blanket isotropic processing stop layer 28 to form a series of patterned isotropic processing stop layers 28a, 28b, 28c and 28d, while employing the blanket gate electrode material layer 26 as an etch stop layer and the series of patterned isotropically processed material layers 34a, 34b, 34c and 34d as an etch mask layer.

The blanket isotropic processing stop layer 28 may be patterned while employing a selective reactive ion etch method.

Figure 8:
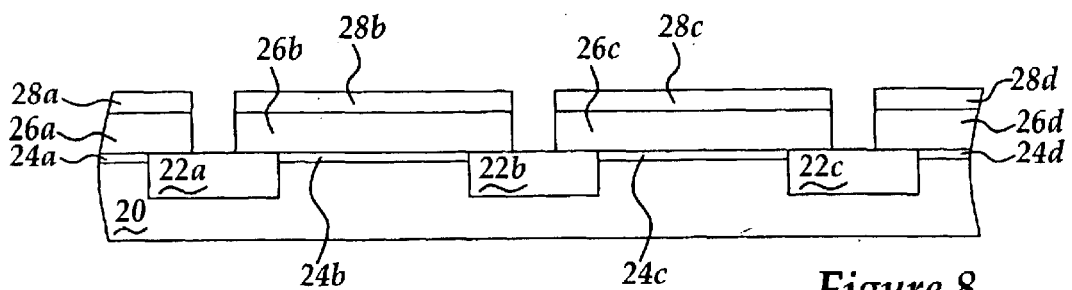

FIG. 8 illustrates the results of: (1) stripping the series of patterned isotropically processed material layers 34a, 34b, 34c and 34d from the series of patterned isotropic processing stop layers 28a, 28b, 28c and 28d; and (2) employing the series of patterned isotropic processing stop layers 28a, 28b, 28c and 28d as a mask for etching the blanket floating gate electrode material layer 26 to form a series of once patterned floating gate electrode material layers 26a, 26b, 26c and 26d. Thus, within the preferred embodiment of the invention, the series of patterned isotropically processed material layers 34a, 34b, 34c and 34d is employed indirectly as an etch mask for patterning the blanket floating gate electrode material layer 26 when forming the series of once patterned floating gate electrode material layers 26a, 26b, 26c and 26d.

Typically, the blanket floating gate electrode material layer 26 is patterned to form the series of once patterned floating gate electrode material layers 26a, 26b, 26c and 26d while employing an anisotropic plasma etch method employing a chlorine containing etchant gas composition.

Figure 9:
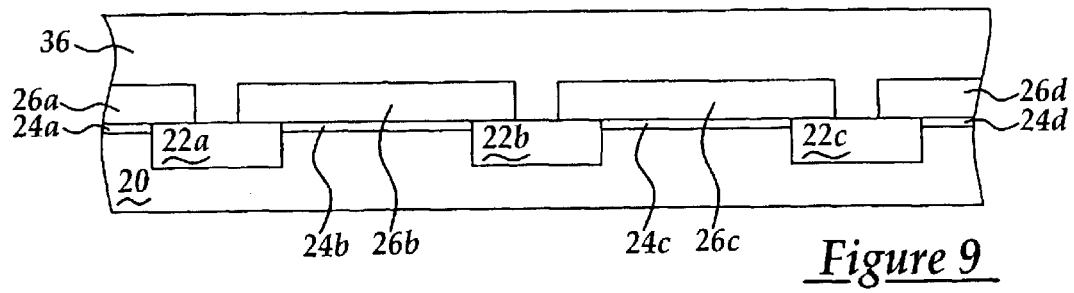

FIG. 9 illustrates the results of: (1) stripping from the series of once patterned floating gate electrode material layers 26a, 26b, 26c and 26d the series of patterned isotropic processing stop layers 28a, 28b, 28c and 28d; and (2) forming upon the resulting semiconductor product structure a blanket planarizing stop layer 36.

The series of patterned isotropic processing stop layers 28a, 28b, 28c and 28d when formed of a silicon nitride material may be stripped while employing a phosphoric acid etchant at elevated temperature. The blanket planarizing stop layer 36 is typically formed of a silicon nitride material, formed to a thickness of from about 1000 to about 5000 angstroms, while employing an otherwise generally conventional deposition method.

FIG. 10 to FIG. 16 illustrate the results of further processing of the semiconductor product as illustrated in FIG. 9, but in accord with the perpendicular cross-section B—B as illustrated within FIG. 1.

Figure 10:
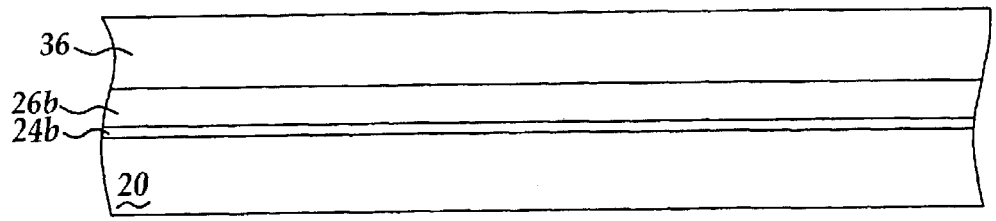

FIG. 10 illustrates the semiconductor substrate 20, having formed thereupon the tunneling dielectric layer 24b (which serves as a gate dielectric layer). In turn, the tunneling dielectric layer 24b has formed thereupon the once patterned floating gate electrode material layer 26b which in turn has formed thereupon the blanket planarizing stop layer 26.

Figure 11:
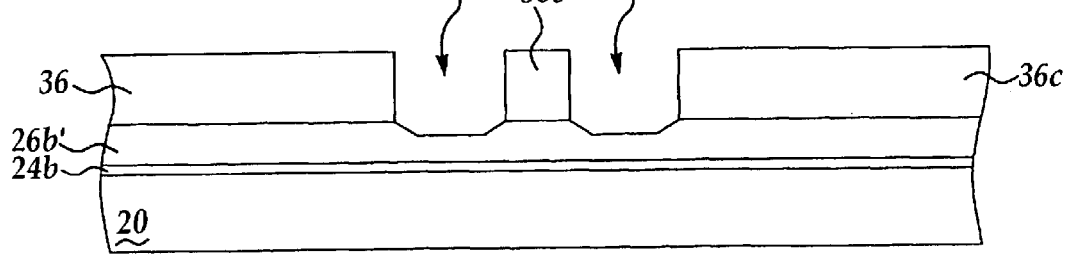

FIG. 11 illustrates the results of etching the blanket planarizing stop layer 36 to form a series of patterned planarizing stop layers 36a, 36b and 36c which defines a pair of apertures 37a and 37b. As is also illustrated in FIG. 11, the blanket floating gate electrode material layer 26 exposed at the bottom of each of the pair of apertures 37a and 37b is etched with a curvature such as to provide a partially etched once patterned floating gate electrode material layer 26b' comprising pointed edges and tips at the juncture with the series of patterned planarizing stop layers 36a, 36b and 36c.

To effect the foregoing result, the once patterned floating gate electrode material layer 26b may be etched within an isotropic etchant, such as a nitric, hydrofluoric and acetic acid mixture.

Figure 12:
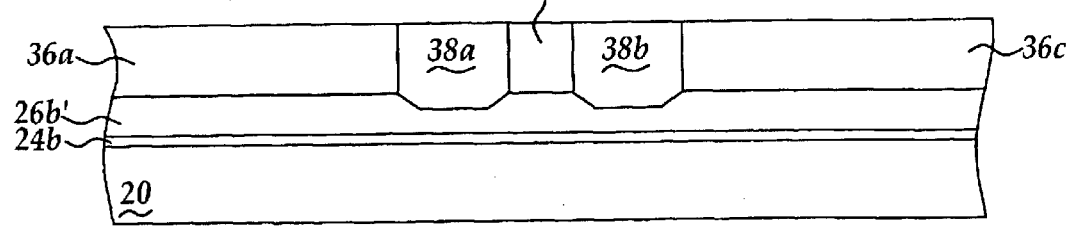

FIG. 12 illustrates the results of forming a pair of patterned planarized aperture fill layers 38a and 38b into the pair of apertures 37a and 37b defined by the series of patterned planarizing stop layers 36a, 36b and 36c.

The pair of patterned planarized aperture fill layers 38a and 38b is typically formed of a silicon oxide material and planarized while employing a chemical mechanical polish (CMP) planarizing method.

Figure 13:
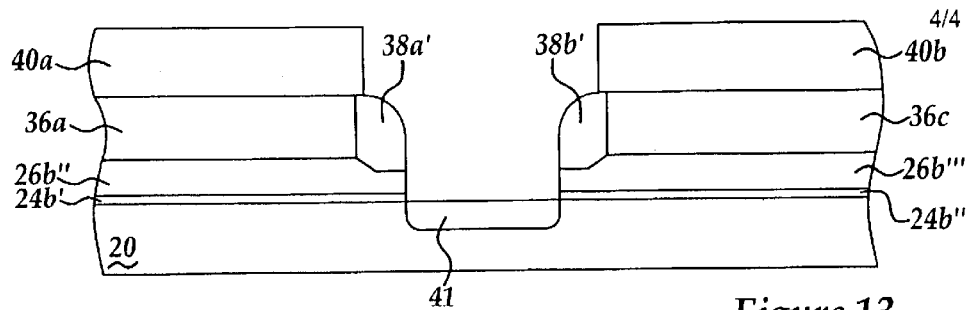

FIG. 13 illustrates the results of: (1) forming a pair of patterned photoresist layers 40a and 40b upon the pair of patterned planarizing stop layers 36a and 36c and bridging to the pair of patterned planarized aperture fill layers 38a and 38b; (2) stripping the patterned planarizing stop layer 36b from the partially etched once patterned floating gate electrode material layer 26b'; (3) anisotropically etching the pair of patterned planarized aperture fill layers 38a and 38b to form a pair of anisotropically etched patterned planarized aperture fill layers 38a' and 38b'; (4) sequentially etching the partially etched once patterned floating gate electrode material layer 26b' and the tunneling dielectric layer 24b to form a corresponding pair of partially etched twice patterned floating gate electrode material layers 26b" and 26b"' and a pair of patterned tunneling dielectric layers 24b' and 24b"; and (5) forming within the thus exposed portion of the semiconductor substrate 20 a source region 41.

The pair of patterned photoresist layers 40a and 40b may be formed employing methods and photoresist materials as are otherwise generally conventional in the semiconductor product fabrication art. The patterned planarizing stop layer 36b when formed of a silicon nitride material may be stripped while employing a phosphoric acid etchant at elevated temperature. The remaining layers as described above may then be sequentially etched while employing an etchant gas composition comprising a fluorine containing etchant gas, followed by a chlorine containing etchant gas, and finally followed by a fluorine containing etchant gas. Finally, the source region 41 may be formed employing ion implant methods and dopant materials as are otherwise conventional in the semiconductor product fabrication art.

Figure 14:
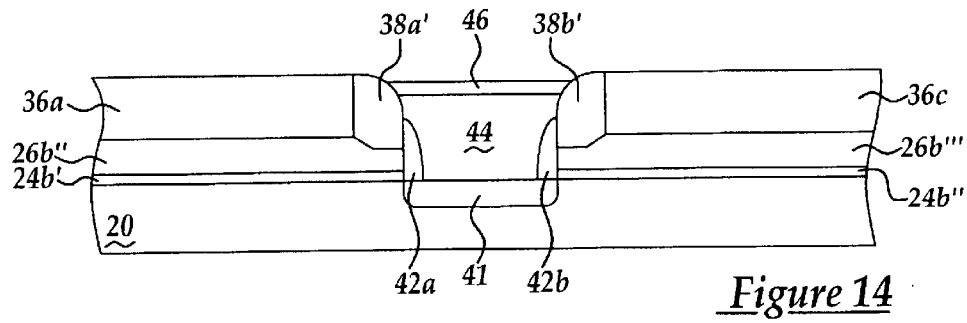

FIG. 14 illustrates the results of: (1) stripping the pair of patterned photoresist layers 40a and 40b from the pair of patterned planarizing stop layers 36a and 36b; (2) forming adjoining a pair of sidewalls of the pair of partially etched twice patterned floating gate electrode material layers 26b" and 26b"' and the pair of patterned tunneling dielectric layers 24b' and 24b" a pair of dielectric spacer layers 42a and 42b;

and (3) forming contacting the source region 41 a conductor contact plug 44 having formed thereupon a sacrificial silicon oxide layer 46.

The pair of patterned photoresist layers 40a and 40b may be stripped while employing methods as are conventional in the semiconductor product fabrication art. The pair of dielectric spacer layers 42a and 42b may be formed of a silicon oxide material. The conductor contact plug 44 is typically formed of a doped polysilicon material and the sacrificial oxide layer is typically formed incident to thermal oxidation of the doped polysilicon material from which is formed the conductor contact plug 44.

Figure 15:
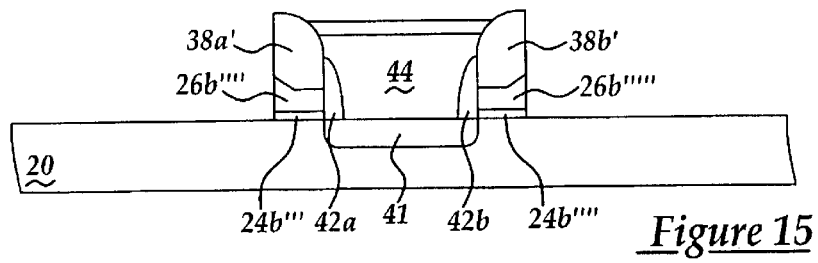

FIG. 15 illustrates the results of: (1) stripping the pair of patterned planarizing stop layers 36a and 36b from the pair of partially etched twice patterned floating gate electrode material layers 26b''' and 26b'''; (2) etching the pair of partially etched twice patterned floating gate electrode material layers 26b'' and 26b''' and the pair of patterned tunneling dielectric layers 24b' and 24b'' to form a corresponding pair of floating gate electrodes 26b'''' and 26b'''', and pair of twice patterned tunneling dielectric layers 24b''' and 24b'''' while simultaneously stripping the sacrificial dielectric layer 46.

The pair of patterned planarizing stop layers 36a and 36c may be stripped employing an aqueous phosphoric acid etchant, at elevated temperature. The pair of floating gate electrodes 26b'''' and 26b'''' may be formed incident to etching within a chlorine containing plasma. The pair of twice patterned tunneling dielectric layers 24b''' and 24b'''' may be formed and the sacrificial oxide layer 46 may be stripped, while employing a fluorine containing plasma etch method.

Figure 16:
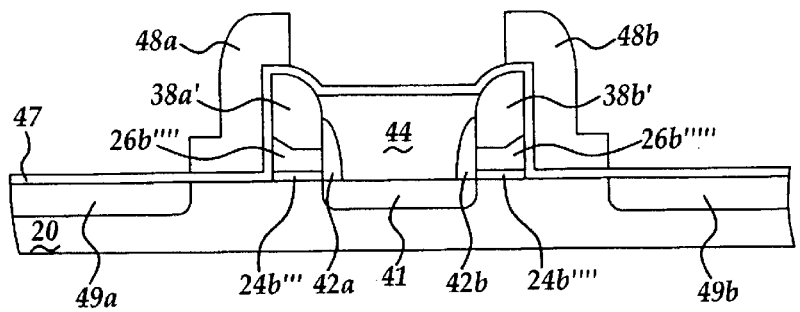

FIG. 16 first illustrates the results of forming a blanket intergate electrode dielectric layer 47 upon the semiconductor product structure as illustrated within FIG. 15. FIG. 16 also illustrates a pair of control gate electrodes 48a and 48b formed upon the blanket intergate electrode dielectric layer 47 and partially overlapping the pair of floating gate electrodes 26b'''' and 26b''''. FIG. 16 finally illustrates a pair of source/drain regions 49a and 49b formed into the semiconductor substrate 20 adjoining the pair of control gate electrodes 48a and 48b.

Within the invention, the blanket intergate electrode dielectric layer 47 is typically formed of a composite of a silicon oxide and silicon nitride dielectric material, formed to a thickness of from about 20 to about 200 angstroms. In addition, the pair of floating gate electrodes 48a and 48b is typically formed of a doped polysilicon material, formed to a thickness of from about 1500 to about 3500 angstroms. Finally, the pair of drain regions 49a and 49b is typically formed incident to ion implanting a dopant of an appropriate polarity to provide the pair of drain regions of dopant concentration from about 1E16 to about 1E18 dopant atoms per cubic centimeter.

FIG. 16 illustrates a schematic cross-sectional diagram of a split gate field effect transistor device fabricated in accord with a preferred embodiment of the invention. The split gate field effect transistor device may be formed in an array with enhanced areal density. The invention realizes the foregoing object by employing as an etch mask when forming a floating gate electrode from a blanket floating gate electrode material layer a patterned isotropically processed material layer which encroaches beneath a patterned mask layer which is employed as a mask when forming the patterned isotropically processed material layer from a blanket isotropically processable material layer. Due to the encroachment of the patterned isotropically processed material layer beneath the mask, a gap between adjacent patterned isotropically processed material layers may be less than a linewidth of the patterned mask layer, which may otherwise be formed at a minimum photolithographically resolvable linewidth. Thus, a pair of floating gate electrodes may be formed with closer spacing and a pair of split gate field effect transistor devices incorporating the pair of floating gate electrodes may be formed with enhanced areal density.

The preferred embodiment of the invention is illustrative of the invention rather than limiting of the invention. Revisions and modifications may be made to methods, materials, structures and dimensions in accord with the preferred embodiment of the invention while still providing an embodiment of the invention, further in accord with the accompanying claims.

What is claimed is:

1. A method for forming a floating gate electrode comprising:

providing a semiconductor substrate;

forming upon the semiconductor substrate a tunneling dielectric layer;

forming upon the tunneling dielectric layer a blanket floating gate electrode material layer;

forming upon the blanket floating gate electrode material layer a thermal oxidation stop layer;

forming upon the thermal oxidation stop layer a blanket silicon layer;

forming upon the blanket silicon layer a patterned mask layer;

thermally oxidizing the blanket silicon layer to form a patterned silicon oxide layer which encroaches beneath the patterned mask layer; and etching the blanket floating gate electrode material layer to form a floating gate electrode while employing the patterned silicon oxide layer as an etch mask layer.

2. The method of claim 1 wherein the tunneling dielectric layer is formed to a thickness of from about 30 to about 70 angstroms.

3. The method of claim 1 wherein the blanket floating gate electrode material layer is formed to a thickness of from about 1500 to about 3500 angstroms.

4. The method of claim 1 wherein the blanket silicon layer is formed to a thickness of from about 1500 to about 3500 angstroms.

5. The method of claim 1 wherein the blanket silicon layer is formed of an amorphous silicon material.

6. The method of claim 1 wherein the blanket silicon layer is formed of a polysilicon material.

7. The method of claim 1 wherein the patterned silicon oxide layer encroaches for a distance of from about 500 to about 2000 angstroms beneath the patterned mask layer.

8. A method for forming a split gate field effect transistor device comprising:

providing a semiconductor substrate;

forming upon the semiconductor substrate a tunneling dielectric layer;

forming upon the tunneling dielectric layer a blanket floating gate electrode material layer;

forming upon the blanket floating gate electrode material layer a thermal oxidation stop layer;

forming upon the thermal oxidation stop layer a blanket silicon layer;

forming upon the blanket silicon layer a patterned mask layer;

thermally oxidizing the blanket silicon layer to form a patterned silicon oxide layer which encroaches beneath the patterned mask layer;

etching the blanket floating gate electrode material layer to form a floating gate electrode while employing the patterned silicon oxide layer as an etch mask layer;

forming upon the floating gate electrode an intergate electrode dielectric layer; and forming upon the intergate electrode a control gate electrode.

9. The method of claim 8 wherein the tunneling dielectric layer is formed to a thickness of from about 30 to about 70 angstroms.

10. The method of claim 8 wherein the blanket floating gate electrode material layer is formed to a thickness of from about 1500 to about 3500 angstroms.

11. The method of claim 8 wherein the blanket silicon layer is formed to a thickness of from about 1500 to about 3500 angstroms.

12. The method of claim 8 wherein the blanket silicon layer is formed of an amorphous silicon material.

13. The method of claim 8 wherein the blanket silicon layer is formed of a polysilicon material.

14. The method of claim 8 wherein the patterned silicon oxide layer encroaches for a distance of from about 500 to about 2000 angstroms beneath the patterned mask layer.

15. The method of claim 8 wherein the blanket intergate electrode dielectric layer is formed to a thickness of from about 20 to about 200 angstroms.

* * * * *